United States Patent
Agostini et al.

(10) Patent No.: US 10,077,947 B2
(45) Date of Patent: Sep. 18, 2018

(54) COOLING ASSEMBLY AND METHOD FOR MANUFACTURING THE SAME

(71) Applicant: ABB Schweiz AG, Baden (CH)

(72) Inventors: Bruno Agostini, Zürich (CH); Daniele Torresin, Birmenstorf (CH); Francesco Agostini, Zürich (CH); Mathieu Habert, Rixheim (FR); Timo Koivuluoma, Vantaa (FI)

(73) Assignee: ABB Schweiz AG, Baden (CH)

( * ) Notice: Subject to any disclaimer, the term of this patent is extended or adjusted under 35 U.S.C. 154(b) by 69 days.

(21) Appl. No.: 15/272,137

(22) Filed: Sep. 21, 2016

(65) Prior Publication Data

US 2017/0082379 A1    Mar. 23, 2017

(30) Foreign Application Priority Data

Sep. 21, 2015  (EP) .................................. 15186080

(51) Int. Cl.
| | |
|---|---|
| F28D 15/00 | (2006.01) |
| F28D 15/04 | (2006.01) |
| F28D 15/02 | (2006.01) |
| F28F 3/02 | (2006.01) |

(Continued)

(52) U.S. Cl.
CPC ....... F28D 15/046 (2013.01); F28D 15/0233 (2013.01); F28D 15/0266 (2013.01);
(Continued)

(58) Field of Classification Search
CPC ............... F28D 15/046; F28D 15/0233; F28D 15/0266; F28D 15/0275; F28D 15/0283;
(Continued)

(56) References Cited

U.S. PATENT DOCUMENTS

| | | | |
|---|---|---|---|
| 7,508,668 B2 * | 3/2009 | Harada | H01L 25/072 361/689 |
| 7,965,508 B2 * | 6/2011 | Yamamoto | H01L 23/473 174/15.1 |

(Continued)

FOREIGN PATENT DOCUMENTS

| | | |
|---|---|---|
| CN | 101566331 A | 10/2009 |
| CN | 101886801 B | 3/2012 |

(Continued)

OTHER PUBLICATIONS

European Patent Office, Extended Search Report issued in corresponding Application No. 15186080.6, dated Apr. 7, 2016, 9 pp.

*Primary Examiner* — Justin Jonaitis
(74) *Attorney, Agent, or Firm* — J. Bruce Schelkopf; Taft Stettinius & Hollister LLP

(57) ABSTRACT

A cooling assembly comprising a plurality of fin elements stacked in a stack direction, a plurality of coolant channels each located between adjacent fin elements and extending in a coolant channel direction perpendicular to the stack direction, a first heat transfer surface adapted to be in contact with a heat generating element, and a second heat transfer surface spaced apart from the first heat transfer surface, the plurality of fin elements and the plurality of coolant channels being located between the first heat transfer surface and the second heat transfer surface. Each of the fin elements comprises a pulsating heat pipe embedded therein, a main pulsating direction of each of the pulsating heat pipes being substantially parallel to a normal of the first heat transfer surface.

17 Claims, 4 Drawing Sheets

(51) Int. Cl.
*F28F 13/10* (2006.01)
*H01L 23/427* (2006.01)
*H01L 23/467* (2006.01)
*F28D 21/00* (2006.01)

(52) U.S. Cl.
CPC ..... *F28D 15/0275* (2013.01); *F28D 15/0283* (2013.01); *F28D 15/04* (2013.01); *F28F 3/02* (2013.01); *F28F 3/025* (2013.01); *F28F 13/10* (2013.01); *H01L 23/427* (2013.01); *H01L 23/467* (2013.01); *F28D 2021/0029* (2013.01); *F28F 2215/06* (2013.01)

(58) Field of Classification Search
CPC .. F28D 15/04; F28D 2021/0029; F28D 15/00; F28D 1/05391; F28D 2015/0216; F28F 3/02; F28F 3/025; F28F 13/10; F28F 2215/06; F28F 1/022; F28F 2260/02; F28F 1/325; F28F 9/0278; H01L 23/427; H01L 23/467; H01L 23/473; H01L 23/4012; H01L 2924/0002; H05K 7/20309; H05K 7/20318; H05K 7/20327; H05K 7/20336; H05K 7/20927
USPC .......... 165/104.26, 166, 172, 128, 164, 177; 361/700, 701, 702, 704, 689, 688
See application file for complete search history.

(56) References Cited

U.S. PATENT DOCUMENTS

| 2001/0033477 | A1* | 10/2001 | Inoue | H01L 23/4006 361/718 |
| 2003/0192674 | A1* | 10/2003 | Ippoushi | F28D 15/0233 165/104.21 |
| 2006/0146496 | A1* | 7/2006 | Asfia | H05K 7/20672 361/700 |
| 2011/0080711 | A1* | 4/2011 | Yesin | H01L 23/427 361/700 |
| 2013/0077245 | A1* | 3/2013 | Gradinger | F28D 1/035 361/700 |
| 2013/0104592 | A1* | 5/2013 | Cottet | H05K 7/20672 62/419 |

FOREIGN PATENT DOCUMENTS

| CN | 203215640 U | 9/2013 |
| EP | 2112689 A2 | 10/2009 |
| EP | 2112689 A3 | 6/2012 |
| EP | 2811251 A1 | 12/2014 |
| EP | 2876400 A1 | 5/2015 |
| KR | 20110128539 A | 11/2011 |
| KR | 20130111035 A | 10/2013 |

* cited by examiner

COOLING ASSEMBLY AND METHOD FOR MANUFACTURING THE SAME

FIELD OF THE INVENTION

The invention relates to a cooling assembly and a method for manufacturing the same.

It is known in the art to use a heat sink for cooling an electric drive. A heat sink is a passive heat exchanger which works in any orientation.

One of the disadvantages associated with heat sinks is that their efficiency is low.

BRIEF DESCRIPTION OF THE INVENTION

An object of the present invention is to provide a cooling assembly so as to alleviate the above disadvantage. A further object of the present invention is to provide a method for manufacturing a cooling assembly according to the invention.

The objects of the invention are achieved by a cooling assembly and a method which are characterized by what is stated in the independent claims. The preferred embodiments of the invention are disclosed in the dependent claims.

The invention is based on the idea of embedding a pulsating heat pipe into each fin element of a cooling assembly such that a main pulsating direction of the pulsating heat pipes is substantially parallel to a normal of a heat transfer surface of the cooling assembly adapted to be in contact with a heat generating element.

A pulsating heat pipe as such is known in the art. A known pulsating heat pipe consists of a meandering tube of capillary dimensions with several U-turns. There is no additional capillary structure inside the meandering tube. The meandering tube is partially filled with a working fluid. During operation of the pulsating heat pipe liquid working fluid and bubbles oscillate in the meandering tube thereby transferring heat from a hotter portion of the pulsating heat pipe to a colder portion of the pulsating heat pipe. A pulsating heat pipe works in any orientation.

An advantage of a cooling assembly of the invention is higher efficiency compared to a conventional heat sink having a same size. A cooling assembly according to the invention is also capable of working in any orientation.

A cooling assembly according to the invention can be manufactured using a plate and bar technology which is well known in the art. Utilizing the plate and bar technology lowers manufacturing costs.

In an embodiment each of the pulsating heat pipes comprises a plurality of capillary tube elements such as multiport extruded tube elements sandwiched between lateral wall elements. Such a sandwich structure enables an inexpensive way to manufacture a pulsating heat pipe. In a further embodiment a cooling assembly of the invention comprises a manifold system adapted to provide a working fluid connection between several pulsating heat pipes thereby making it easy to fill the pulsating heat pipes with a working fluid.

BRIEF DESCRIPTION OF THE DRAWINGS

In the following the invention will be described in greater detail by means of preferred embodiments with reference to the attached drawings, in which.

DETAILED DESCRIPTION OF THE INVENTION

Figure 1:
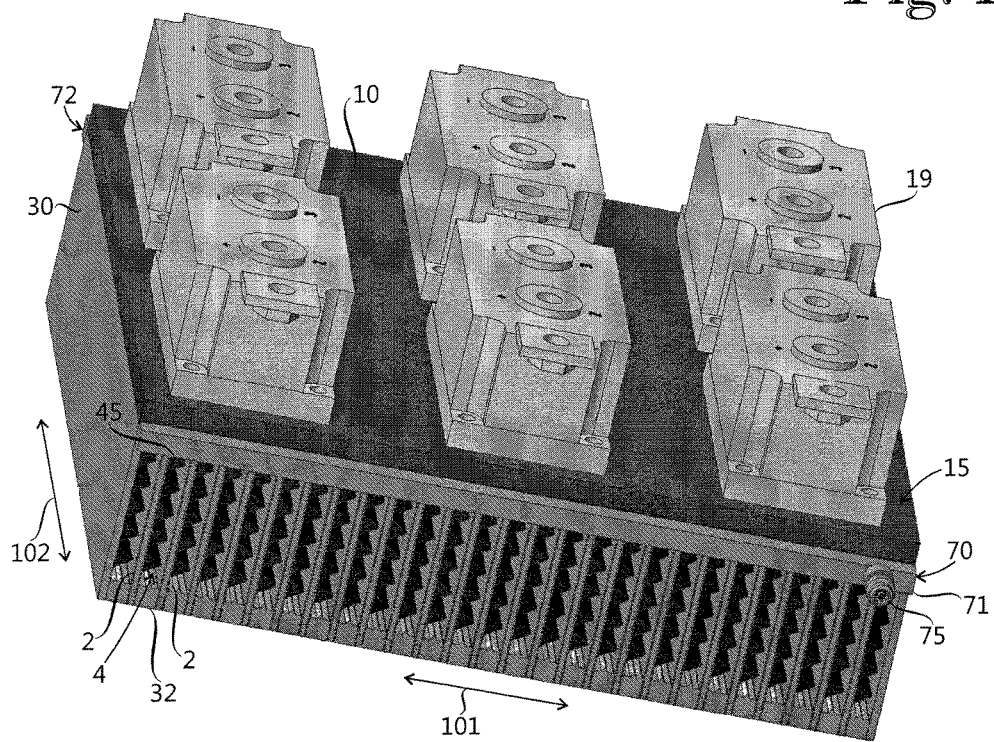
FIG. 1 shows a cooling assembly according to an embodiment of the invention.
Figure 2:
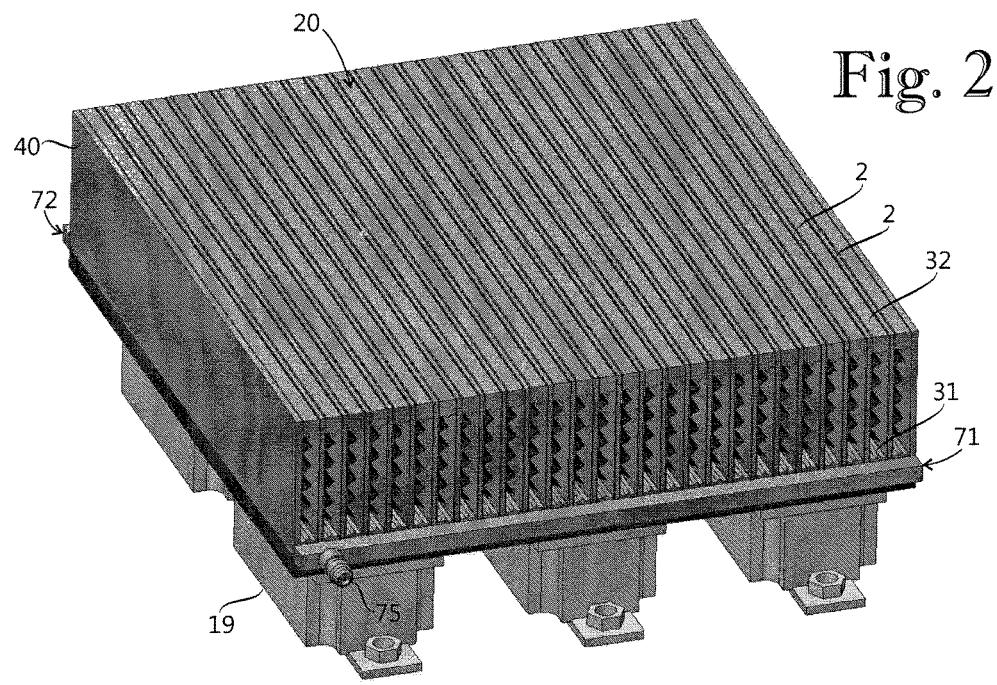
FIG. 2 shows the cooling assembly of FIG. 1 from a different direction.

FIG. 1 shows a cooling assembly according to an embodiment of the invention. FIG. 2 shows the cooling assembly of FIG. 1 from a different direction. The cooling assembly comprises a plurality of fin elements 2, a plurality of first bar elements 31, a plurality of second bar elements 32, a plurality of coolant channels 4, a plurality of air fin elements 45, a first heat transfer surface 10, a second heat transfer surface 20, a manifold system 70 and a valve system 75.

The fin elements 2 are stacked in a stack direction 101. The stacked fin elements 2 are spaced apart from each other by the first bar elements 31 and the second bar elements 32 such that there is a first bar element 31 and a second bar element 32 between each adjacent fin elements 2 in the stack direction 101 for providing the corresponding coolant channel 4.

Each of the coolant channels 4 is located between corresponding adjacent fin elements 2 in the stack direction 101 and between corresponding first bar element 31 and second bar element 32 in the main pulsating direction. Each of the coolant channels 4 extends in a coolant channel direction 102 perpendicular to the stack direction 101 and is adapted for a flow of a gaseous cooling medium. Each of the air fin elements 45 is located in a corresponding coolant channel 4 and adapted to enhance heat transfer between an adjacent fin element 2 and a flow of a gaseous cooling medium in the coolant channel 4 by increasing a heat transfer surface.

The first heat transfer surface 10 is adapted to be in contact with a heat generating element. The first heat transfer surface 10 is a planar surface. In FIGS. 1 and 2 there are six heat generating elements 19 in contact with the first heat transfer surface 10. A normal of the first heat transfer surface 10 is perpendicular to both the stack direction 101 and the coolant channel direction 102.

The second heat transfer surface 20 is spaced apart from the first heat transfer surface 10. The second heat transfer surface 20 is a planar surface. The plurality of fin elements 2 and the plurality of coolant channels 4 are located between the first heat transfer surface 10 and the second heat transfer surface 20. The second heat transfer surface 20 is adapted to be in contact with a heat generating element. In an alternative embodiment the second heat transfer surface is utilized as a cooling surface adapted to transfer heat out of the cooling assembly.

Each of the fin elements 2 comprises a pulsating heat pipe embedded therein, a main pulsating direction of each of the pulsating heat pipes being parallel to a normal of the first heat transfer surface 10. In FIG. 1 the main pulsating direction of the pulsating heat pipes is perpendicular to a plane defined by the stack direction 101 and the coolant channel direction 102.

When there are heat generating elements installed on both the first heat transfer surface 10 and the second heat transfer surface 20, the pulsating heat pipes transfer heat from the first heat transfer surface 10 and the second heat transfer surface 20 to the coolant channels 4 from which a flow of a gaseous cooling medium present in the coolant channels 4 transfers the heat out of the cooling assembly. If there are heat generating elements installed only on the first heat transfer surface 10, the pulsating heat pipes transfer heat from the first heat transfer surface 10 towards the second heat transfer surface 20, and the heat exits the cooling assembly through the second heat transfer surface 20 and the coolant channels 4. In both cases mentioned above a small portion of heat exits the cooling assembly through side walls whose normals are parallel to the stack direction 101. Those side walls are discussed later.

In the embodiment of FIG. 1 the first heat transfer surface 10 is a surface of a base plate 15. Heat is adapted to transfer from the heat generating elements 19 through the base plate 15 to the fin elements 2 and the first bar elements 31. In an alternative embodiment there is no separate base plate and a first heat transfer surface is formed by fin elements and first bar elements.

Figure 3:
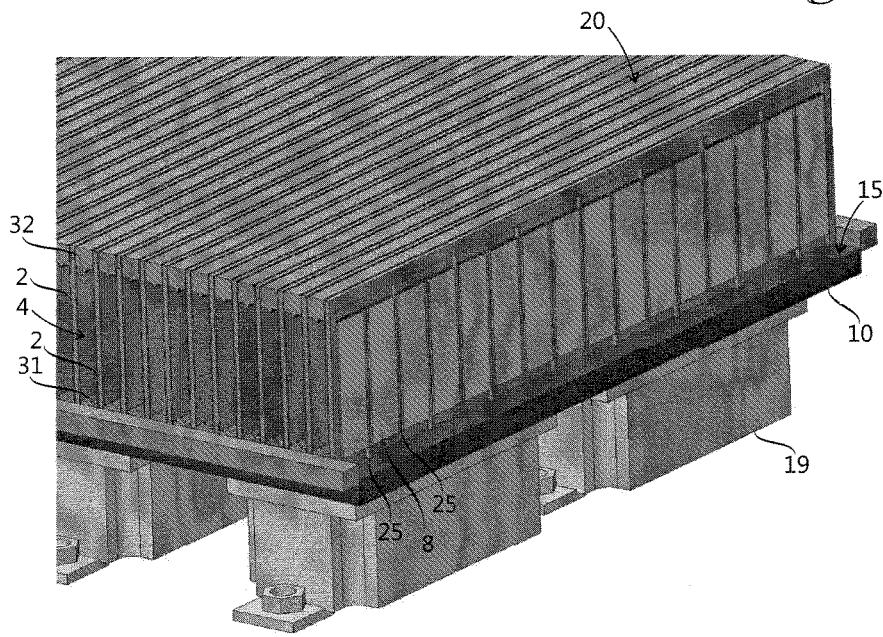
FIG. 3 shows a detail of a partially disassembled cooling assembly of FIG. 1.
Figure 4:
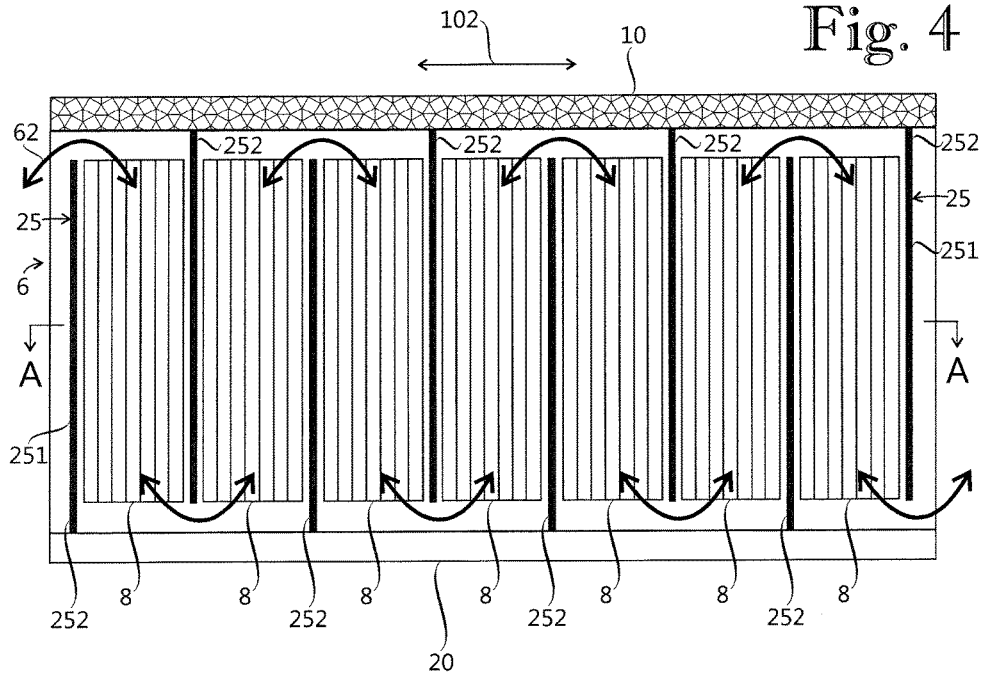
FIG. 4 illustrates a structure and operation of a pulsating heat pipe of the cooling assembly of FIG. 3.
Figure 5:
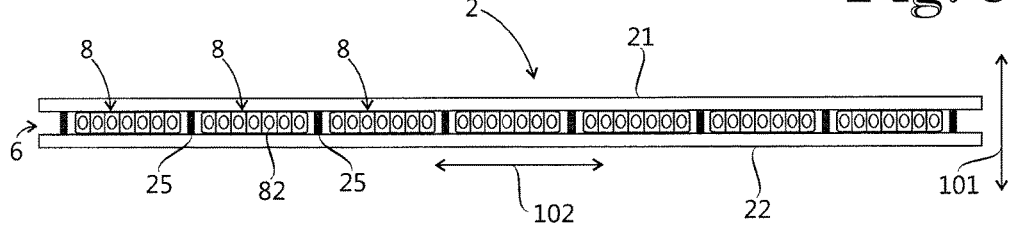
FIG. 5 shows a cross section of the pulsating heat pipe of FIG. 4 taken along line A-A.

FIG. 3 shows a detail of a partially disassembled cooling assembly of FIG. 1. In FIG. 3 a portion of an outermost fin element has been removed to reveal an inner structure of the outermost fin element. FIG. 4 illustrates an inner structure and operation of a pulsating heat pipe 6 embedded in the outermost fin element as viewed from a direction parallel to the stack direction 101. FIG. 4 only illustrates a portion of the heat pipe 6 in the coolant channel direction 102. FIG. 5 shows a cross section of the pulsating heat pipe 6 of FIG. 4 taken along line A-A.

Each of the fin elements 2 comprises a first lateral wall element 21, a second lateral wall element 22 and a plurality of flow separators 25. A meandering flow path for a working fluid of the pulsating heat pipe 6 is located between the first lateral wall element 21 and the second lateral wall element 22 in the stack direction 101. In FIG. 4, the meandering flow path for the working fluid is illustrated with flow arrows 62, and the main pulsating direction is parallel to the vertical direction.

The flow separators 25 are placed in a staggered arrangement between the first lateral wall element 21 and the second lateral wall element 22 such that adjacent flow separators 25 are spaced apart from each other in the coolant channel direction 102 for guiding a flow of working fluid in the pulsating heat pipe 6 and providing the meandering flow path for the working fluid.

In an alternative embodiment a cooling assembly comprises flow separators formed by embossing the first lateral wall element and/or the second lateral wall element. Said embossed flow separators are adapted to function the same way as the flow separators formed by physical inserts shown in FIGS. 4 to 6. In many embodiments it is easier and cheaper to use embossed flow separators instead of physical inserts.

In a further alternative embodiment a cooling assembly comprises flow separators which are integrated into the first lateral wall element and/or the second lateral wall element by a process other than embossing. For example, it is possible to mould or 3D print lateral wall elements with integrated flow separators.

Each of the pulsating heat pipes 6 comprises a plurality of capillary tube elements 8 each including a plurality of capillary tubes 82 adapted to define a flow path for the working fluid in the main pulsating direction. Each of the flow separators 25 is adapted for guiding a flow of working fluid from one capillary tube element 8 to adjacent capillary tube element 8 such that the meandering flow path for the working fluid is provided. In FIG. 4 the flow separators 25 alternately allow the working fluid to pass from one capillary tube element 8 to adjacent capillary tube element 8 in an upper portion and lower portion of the pulsating heat pipe 6. It should be noted that during a normal operation of a pulsating heat pipe 6 a working fluid inside the pulsating heat pipe 6 in practice oscillates back and forth in the main pulsating direction without propagating in the coolant channel direction.

Each of the capillary tube elements 8 is a multiport extruded tube element, or MPE tube element. In an embodiment the capillary tube elements are made of aluminium. It is also possible to manufacture the first bar elements, the second bar elements and the first lateral wall elements and the second lateral wall elements of the fin elements from aluminium. MPE tube elements are inexpensive to manufacture since a long intermediate multiport extruded element can be cut in MPE tube elements having appropriate length. Manufacturing of multiport extruded tubes is known in the art. In an alternative embodiment capillary tube elements comprise conventional folded fin structures.

Figure 6:
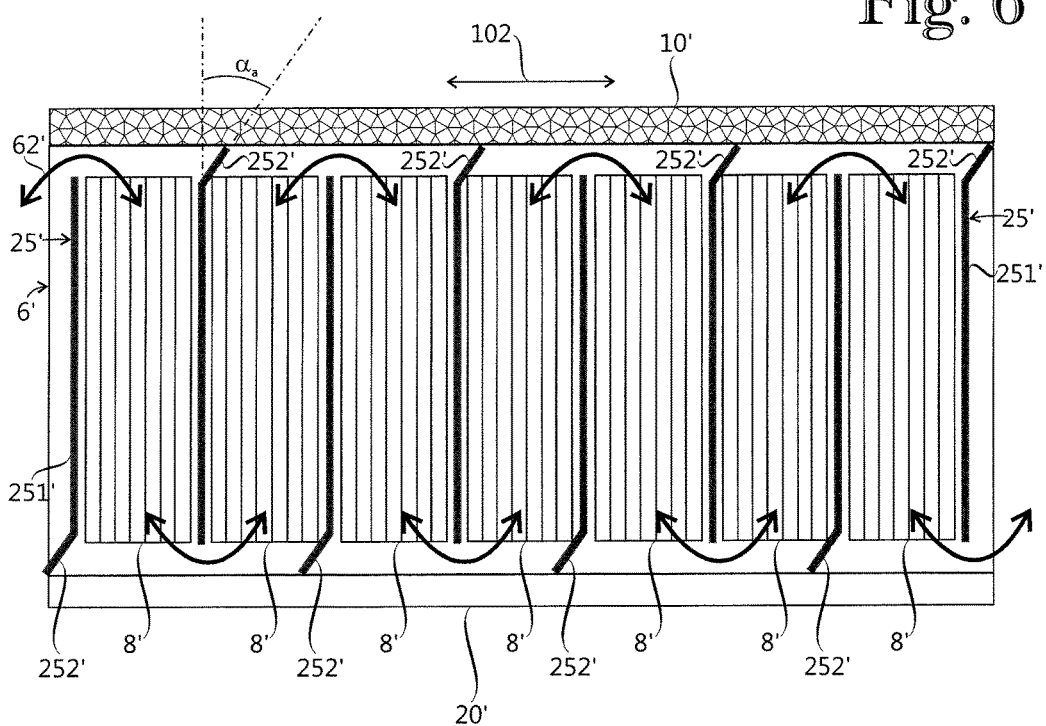
FIG. 6 illustrates a structure and operation of a pulsating heat pipe of a cooling assembly according to alternative embodiment of the invention.

FIG. 6 illustrates a structure and operation of a pulsating heat pipe of a cooling assembly according to alternative embodiment of the invention. The flow separators 25' of FIG. 6 have a different form than the flow separators 25 of FIG. 4. In other respects the pulsating heat pipes of FIGS. 4 and 6 are identical.

Each of the flow separators 25' comprises a first part 251' extending linearly substantially parallel to the main pulsating direction and being located between adjacent capillary tube elements 8' in the coolant channel direction 102, and a second part 252' spaced apart from the adjacent capillary tube elements 8' in the main pulsating direction for guiding a flow of working fluid from one capillary tube element to adjacent capillary tube element such that the meandering flow path for the working fluid is provided. The second part 252' comprises a skew portion extending in a separator angle $\alpha_a$ relative to the first part 251'. The separator angle $\alpha_a$ is approximately 35°. In an alternative embodiment a separator angle is greater than 15°.

The skew portions of the flow separators 25' are adapted to prevent unwanted displacement of the capillary tube elements 8' during assembly of the fin element. A flow separator 25' provided with a skew portion at its upper end prevents an adjacent capillary tube element 8' from moving upwards beyond its proper location. Correspondingly, a flow separator 25' provided with a skew portion at its lower end prevents an adjacent capillary tube element 8' from moving downwards beyond its proper location.

Basically the flow separators 25' shown in FIG. 6 are capable of preventing unwanted displacement of every second capillary tube element 8'. In an alternative embodiment each flow separator has a Y-shaped cross section such that a skew portion of FIG. 6 has been duplicated by mirroring the skew portion with relation to the main pulsating direction. Such a Y-shaped flow separator is capable of preventing unwanted displacement of each adjacent capillary tube element towards the direction of the skew portions.

In an alternative embodiment which comprises flow separators integrated into a first lateral wall element and/or a second lateral wall element of a fin element, each flow separator comprises a skew portion adapted to prevent unwanted displacement of an adjacent capillary tube element during assembly of the fin element. In connection with the integrated flow separators, a shape of a skew portion can be selected quite freely.

The manifold system 70 is adapted to provide a working fluid connection between the plurality of pulsating heat pipes 6. Each of the fin elements 2 comprises a fluid opening which is in fluid connection with a fluid aperture of the manifold system 70. The fluid opening provides an access to a fluid space inside the corresponding pulsating heat pipe 6.

The manifold system 70 comprises a first manifold 71 and a second manifold 72, each one of which extends in the stack direction 101. The first manifold 71 is located at a first end of the cooling assembly and the second manifold 72 is located at the second end of the cooling assembly, the first end of the cooling assembly being an opposite end relative to a second end of the cooling assembly, the first end and the second end of the cooling assembly being spaced apart in the coolant channel direction 102.

The first manifold 71 comprises a fluid cavity inside thereof, the fluid cavity being adapted to provide a path for a working fluid from one end of the first manifold 71 to the other end. The first manifold 71 also comprises a plurality of fluid apertures for providing a working fluid connection between inside of the first manifold 71 and several of the pulsating heat pipes 6.

Figure 7:
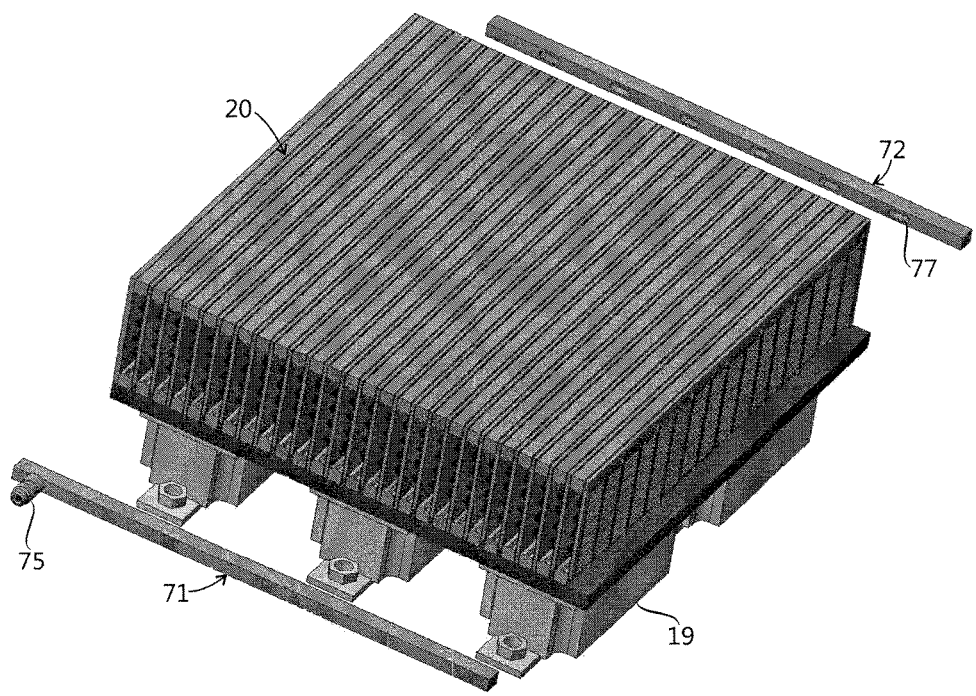
FIG. 7 shows a partially disassembled cooling assembly of FIG. 1.

The second manifold 72 comprises a plurality of connecting apertures 77 each one of which is adapted to provide a fluid connection between two adjacent fin elements. The connecting apertures 77 are visible in FIG. 7 which shows a partially disassembled cooling assembly of FIG. 1. The connecting apertures 77 are not in fluid connection between each other. In an alternative embodiment the second manifold is a hollow element and connecting apertures thereof are in fluid connection between each other. In a further alternative embodiment the manifold system only comprises one manifold which is in fluid connection with the plurality of pulsating heat pipes.

The valve system 75 is adapted for filling each of the pulsating heat pipes 6 with a suitable amount of a working fluid. The valve system 75 comprises a fluid valve connected to the first manifold 71. The fluid valve is located between surfaces defined by the first heat transfer surface 10 and the second heat transfer surface 20. An axial direction of the fluid valve is parallel to the coolant channel direction 102, the axial direction of the fluid valve being the direction in which a working fluid is adapted to flow into the fluid valve. In an alternative embodiment a valve system comprises a plurality of fluid valves.

The cooling assembly comprises a third heat transfer surface 30 and a fourth heat transfer surface 40, each one of which is a planar surface whose normal is parallel to the stack direction 101. The third heat transfer surface 30 and the fourth heat transfer surface 40 are spaced apart from each other in the stack direction 101. The plurality of fin elements 2 is located between the third heat transfer surface 30 and the fourth heat transfer surface 40 in the stack direction 101. Each of the third heat transfer surface 30 and the fourth heat transfer surface 40 is adapted to be in contact with a heat generating element which means that it is possible to install heat generating elements on four sides of the cooling assembly. In an alternative embodiment the third heat transfer surface 30 and the fourth heat transfer surface 40 are utilized as cooling surfaces adapted to transfer heat out of the cooling assembly.

The external form of the cooling assembly is similar to an external form of a conventional heat sink in order to enable the cooling assembly to be fitted in an electric drive designed for the conventional heat sink. This makes it possible to improve cooling of an existing electric drive by retrofitting a cooling assembly according to present invention to the existing electric drive. In an embodiment the electric drive to be cooled comprises an inverter, a frequency converter or a DC to DC converter.

Figure 8:
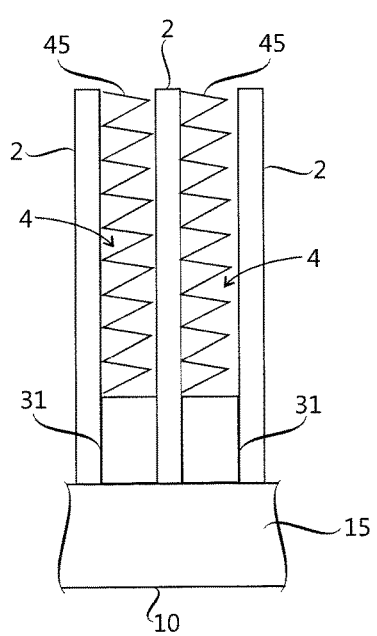
FIG. 8 illustrates a detail of the cooling assembly of FIG. 1 as seen from a coolant channel direction.

FIG. 8 illustrates a detail of the cooling assembly of FIG. 1 as seen from a coolant channel direction. FIG. 8 shows that a heat transfer surface between the base plate 15 and the fin elements 2 is relatively small. A major portion of heat transfer between the base plate 15 and a given fin element 2 takes place in the stack direction 101 via the first bar elements 31 adjacent to the fin element 2. Therefore a dimension of the first bar elements 31 in the main pulsating direction affects heat transfer between the base plate 15 and the fin elements 2. Similarly, a dimension of the second bar elements 32 in the main pulsating direction affects heat transfer between the fin elements 2 and the second heat transfer surface 20. Consequently a heat transfer between the fin elements and the first heat transfer surface and the second heat transfer surface can be optimized by an appropriate design of the first bar elements and the second bar elements. In an embodiment the first bar elements and the second bar elements are identical.

A cooling assembly according to the invention can be manufactured using a plate and bar technology. Fin elements of a cooling assembly according to the invention can be designed such that they have substantially identical form as fins of a conventional heat sink.

It will be obvious to a person skilled in the art that the inventive concept can be implemented in various ways. The invention and its embodiments are not limited to the examples described above but may vary within the scope of the claims.

The invention claimed is:

1. A cooling assembly comprising:
   a plurality of fin elements stacked in a stack direction, each of the plurality of fin elements comprising a pulsating heat pipe embedded therein;
   a plurality of coolant channels each located between adjacent fin elements and extending in a coolant channel direction perpendicular to the stack direction, the plurality of coolant channels being configured for a flow of a gaseous cooling medium;
   a first heat transfer surface configured to be in contact with a heat generating element, a normal of the first heat transfer surface being substantially perpendicular to both the stack direction and the coolant channel direction;
   a second heat transfer surface spaced apart from the first heat transfer surface, the plurality of fin elements and the plurality of coolant channels being located between the first heat transfer surface and the second heat transfer surface, wherein each of the fin elements comprises a main pulsating direction of each of the pulsating heat pipes embedded therein, the main pulsating direction of each of the pulsating heat pipes being substantially parallel to a normal of the first heat transfer surface, and
   wherein each of the fin elements comprises a first lateral wall element, a second lateral wall element and a plurality of flow separators, wherein a meandering flow path for a working fluid of the pulsating heat pipe is located between the first lateral wall element and the second lateral wall element in the stack direction, the plurality of flow separators being provided in a staggered arrangement between the first lateral wall element and the second lateral wall element such that adjacent flow separators are spaced apart from each other in the coolant channel direction for guiding a flow of working fluid in the pulsating heat pipe and providing the meandering flow path for the working fluid, and wherein each of the pulsating heat pipes comprises a plurality capillary tube elements each including a plurality of capillary tubes configured to define a flow path for the working fluid in the main pulsating direction, wherein each of the flow separators is configured for guiding a flow of working fluid from one capillary tube element to adjacent capillary tube element such that the meandering flow path for the working fluid is provided, and wherein each of the capillary tube elements is a multiport extruded tube element, and wherein the plurality of flow separators is integrated into the first lateral wall element and/or the second lateral wall element, and wherein each of the flow separators comprises a first part extending linearly substantially parallel to the main pulsating direction and being located between adjacent capillary tube elements in the coolant channel direction, and a second part spaced apart from the adjacent capillary tube elements in the main pulsating direction for guiding a flow of working fluid from one capillary tube element to adjacent capillary tube element such that the meandering flow path for the working fluid is provided.

2. A cooling assembly according to claim 1, wherein the second part comprises at least one skew portion extending a separator angle ($\alpha_a$) relative to the first part, the separator angle being greater than 15°, wherein the at least one skew portion is configured to prevent unwanted displacement of a capillary tube element adjacent the flow separator during assembly of the fin element.

3. A cooling assembly according to claim 1, wherein each of the pulsating heat pipes is connected to several other of the pulsating heat pipes with a working fluid connection.

4. A cooling assembly according to claim 3, wherein the cooling assembly comprises a manifold system for providing said working fluid connection between different pulsating heat pipes, the manifold system comprising a first manifold extending in the stack direction, the first manifold being located at a first end of the cooling assembly, the first end of the cooling assembly being an opposite end relative to a second end of the cooling assembly, the first end and the second end of the cooling assembly being spaced apart in the coolant channel direction.

5. A cooling assembly according to claim 4, wherein the cooling assembly comprises a valve system for filling each of the pulsating heat pipes with a working fluid, the valve system comprising a fluid valve connected to the first manifold.

6. A cooling assembly according to any one of the preceding claims, characterized in that claim 1, wherein the cooling assembly comprises a plurality of air fin elements each of which is located in a corresponding coolant channel and configured to enhance heat transfer between an adjacent fin element and a flow of a gaseous cooling medium in the coolant channel.

7. A cooling assembly according to claim 1, wherein the cooling assembly comprises a third heat transfer surface and a fourth heat transfer surface spaced apart from the third heat transfer surface in the stack direction, the plurality of fin elements being located between the third heat transfer surface and the fourth heat transfer surface, wherein each of the second heat transfer surface, the third heat transfer surface and the fourth heat transfer surface is configured to be in contact with a heat generating element.

8. A cooling assembly according to claim 1, wherein the first heat transfer surface and the second heat transfer surface are planar surfaces and parallel to each other.

9. A cooling assembly according to claim 1, wherein the cooling assembly comprises a plurality of first bar elements and a plurality of second bar elements such that there is one of the first bar elements and one of the second bar elements between each adjacent fin elements in the stack direction for providing the corresponding coolant channel, wherein each of the coolant channels is located between corresponding first and second bar elements in the main pulsating direction.

10. A cooling assembly comprising:
a plurality of fin elements stacked in a stack direction, each of the plurality of fin elements comprising a pulsating heat pipe embedded therein;
a plurality of coolant channels each located between adjacent fin elements and extending in a coolant channel direction perpendicular to the stack direction, the plurality of coolant channels being configured for a flow of a gaseous cooling medium;
a first heat transfer surface configured to be in contact with a heat generating element, a normal of the first heat transfer surface being substantially perpendicular to both the stack direction and the coolant channel direction;
a second heat transfer surface spaced apart from the first heat transfer surface, the plurality of fin elements and the plurality of coolant channels being located between the first heat transfer surface and the second heat transfer surface, wherein each of the fin elements comprises a main pulsating direction of each of the pulsating heat pipes embedded therein, the main pulsating direction of each of the pulsating heat pipes being substantially parallel to a normal of the first heat transfer surface,
wherein each of the fin elements comprises a first lateral wall element, a second lateral wall element and a plurality of flow separators, wherein a meandering flow path for a working fluid of the pulsating heat pipe is located between the first lateral wall element and the second lateral wall element in the stack direction, the plurality of flow separators being provided in a staggered arrangement between the first lateral wall element and the second lateral wall element such that adjacent flow separators are spaced apart from each other in the coolant channel direction for guiding a flow of working fluid in the pulsating heat pipe and providing the meandering flow path for the working fluid,
wherein each of the pulsating heat pipes comprises a plurality capillary tube elements each including a plurality of capillary tubes configured to define a flow path for the working fluid in the main pulsating direction, wherein each of the flow separators is configured for guiding a flow of working fluid from one capillary tube element to adjacent capillary tube element such that the meandering flow path for the working fluid is provided,
wherein each of the capillary tube elements is a multiport extruded tube element,
wherein the plurality of flow separators is integrated into the first lateral wall element and/or the second lateral wall element, and wherein each of the flow separators comprises a first part extending linearly substantially parallel to the main pulsating direction and being located between adjacent capillary tube elements in the coolant channel direction, and a second part spaced apart from the adjacent capillary tube elements in the main pulsating direction for guiding a flow of working fluid from one capillary tube element to adjacent capillary tube element such that the meandering flow path for the working fluid is provided;

wherein the second part comprises at least one skew portion extending a separator angle ($\alpha_a$) relative to the first part, the separator angle being greater than 15°, wherein the at least one skew portion is configured to prevent unwanted displacement of a capillary tube element adjacent the flow separator during assembly of the fin element.

11. A cooling assembly according to claim 10, wherein each of the pulsating heat pipes is connected to several other of the pulsating heat pipes with a working fluid connection.

12. A cooling assembly according to claim 11, wherein the cooling assembly comprises a manifold system for providing said working fluid connection between different pulsating heat pipes, the manifold system-comprising a first manifold extending in the stack direction, the first manifold being located at a first end of the cooling assembly, the first end of the cooling assembly being an opposite end relative to a second end of the cooling assembly, the first end and the second end of the cooling assembly being spaced apart in the coolant channel direction.

13. A cooling assembly according to claim 12, wherein the cooling assembly comprises a valve system for filling each of the pulsating heat pipes with a working fluid, the valve system comprising a fluid valve connected to the first manifold.

14. A cooling assembly according claim 13, wherein the cooling assembly comprises a plurality of air fin elements each of which is located in a corresponding coolant channel and configured to enhance heat transfer between an adjacent fin element and a flow of a gaseous cooling medium in the coolant channel.

15. A cooling assembly according to claim 14, wherein the cooling assembly comprises a third heat transfer surface and a fourth heat transfer surface spaced apart from the third heat transfer surface in the stack direction, the plurality of fin elements being located between the third heat transfer surface and the fourth heat transfer surface, wherein each of the second heat transfer surface, the third heat transfer surface and the fourth heat transfer surface is configured to be in contact with a heat generating element.

16. A cooling assembly according to claim 15, wherein the first heat transfer surface and the second heat transfer surface are planar surfaces and parallel to each other.

17. A cooling assembly according claim 16, wherein the cooling assembly comprises a plurality of first bar elements and a plurality of second bar elements such that there is one of the first bar elements and one of the second bar elements between each adjacent fin elements in the stack direction for providing the corresponding coolant channel, wherein each of the coolant channels is located between corresponding first and second bar elements in the main pulsating direction.

* * * * *